United States Patent [19]
Washio et al.

[11] Patent Number: 4,887,145
[45] Date of Patent: Dec. 12, 1989

[54] SEMICONDUCTOR DEVICE IN WHICH ELECTRODES ARE FORMED IN A SELF-ALIGNED MANNER

[75] Inventors: Katsuyoshi Washio, Hachioji; Tohru Nakamura, Tanashi; Kazuo Nakazato, Kokubunji; Masatada Horiuchi, Koganei; Tetsuya Hayashida, Tokyo, all of Japan

[73] Assignee: Hitachi, Ltd., Tokyo, Japan

[21] Appl. No.: 937,610

[22] Filed: Dec. 3, 1986

[30] Foreign Application Priority Data

Dec. 4, 1985 [JP] Japan .................................. 60-271485
May 30, 1986 [JP] Japan .................................. 61-123325

[51] Int. Cl.$^4$ ............................................ H01L 29/04
[52] U.S. Cl. ........................................ 357/59; 357/34; 357/35; 357/56; 357/23.1
[58] Field of Search ................... 357/59 G, 59 H, 59 I, 357/59 K, 34, 56, 59 R, 35, 23.1; 437/160, 161, 162, 168

[56] References Cited

U.S. PATENT DOCUMENTS

| 4,392,149 | 7/1983 | Horng | 357/59 H |
| 4,510,676 | 4/1985 | Anantha et al. | 357/35 |
| 4,688,063 | 8/1987 | Lu | 357/59 G |
| 4,703,554 | 11/1987 | Havemann | 357/34 |

Primary Examiner—Andrew J. James
Assistant Examiner—Mark Prenty
Attorney, Agent, or Firm—Antonelli, Terry & Wands

[57] ABSTRACT

A bipolar transistor capable of operating at high speeds. In a bipolar transistor designed for operation at high speeds, a polycrystalline silicon layer used as a base electrode effects is a contact area with respect to the base region which lacks precision or tends to increase. Further, when the transistor is formed in a small size, the ratio of the contact area with respect to the polycrystalline area increases, making it difficult to increase the operation speed. In order to reduce the contact area of the polycrystalline silicon layer, this invention deals with the structure in which the polycrystalline silicon layer is brought into contact with a portion near the edge of the convex semiconductor layer maintaining a small size and a high precision.

40 Claims, 14 Drawing Sheets

SEMICONDUCTOR DEVICE IN WHICH ELECTRODES ARE FORMED IN A SELF-ALIGNED MANNER

BACKGROUND OF THE INVENTION

The present invention relates to a semiconductor device and to a method of fabricating the same, and more specifically to the one which is adapted to forming a polycrystalline semiconductor layer having a highly precisely defined junction area on the side walls of a convex semiconductor layer or mesa.

The present invention relates to the structure of a semiconductor device and a method of fabricating the same, and particularly to the structure that is finely constructed and that is adapted to operating at high speeds and to a method of fabricating the same.

In the conventional semiconductor devices as disclosed in Japanese Patent Laid-Open No. 73156/1983, the base electrode of a bipolar transistor is taken out through a polycrystalline semiconductor layer sandwiched between the insulating films in order to realize high-speed operation by maintaining the parasitic capacitance small. The steps for fabricating the polycrystalline semiconductor layer that is a base electrode of the transistor, are shown in FIGS. 1A to 1E. The manufacturing steps will now be described. With reference to FIG. 1A, an n+-type buried layer 2 is formed on a p-type silicon substrate 1, an n-type silicon epitaxial layer 3 is grown thereon, a silicon dioxide film 10 is deposited on the whole surface thereof, an insulating film other than the silicon dioxide film, such as a silicon nitride film ($Si_3N_4$) 50 is deposited thereon, and another silicon dioxide film 20 is further deposited thereon, followed by patterning leaving three layers 10, 50 and 20 on the active region of the transistor. The silicon epitaxial layer is then etched using the three insulating layers 10, 50 and 20 as a mask, so that the active region assumes a convex shape. In this case, the silicon layer inwardly enters from the ends of the masks 10, 50, 20 due to etching.

With reference to FIG. 1B, an oxide film 30 is formed by the thermal oxidation, a silicon nitride film ($Si_3N_4$) 60 is deposited on the whole surface, and the silicon nitride film 60 is left on the side surfaces of the convex silicon layer by selective etching.

With reference to FIG. 1C, an oxide film 40 is formed by the thermal oxidation. The silicon dioxide film grows very little on the side surfaces of the convex silicon layer but grows on the regions other than the convex or mesa area to form a thick oxide film 40.

With reference to FIG. 1D, the silicon nitride film 60 is removed and then the photoresist is applied followed by patterning (100), and a part of the silicon dioxide film 40 is then removed by etching resulting in an opening 200. In this case, the opening 200 is formed at an upper portion of the convex silicon layer.

With reference to FIG. 1E, a polycrystalline silicon layer is formed on the whole surface followed by patterning (300), so that only the side surfaces of the convex portion of the epitaxial layer will come into contact with the polycrystalline silicon layer.

Through the above-mentioned steps, the structure can be realized in which the polycrystalline silicon layer comes into contact with the side surfaces of the convex silicon layer or mesa. However, the silicon dioxide film 40 that is formed by the thermal oxidation in FIG. 1C, also grows on the convex silicon layer in a manner as shown in FIG. 1C. When the silicon dioxide film in FIG. 1D is subjected to the etching, therefore, the area of the opening 200 on the side surface of the convex silicon layer tends to vary. Therefore, when p-type impurities are diffused from the polycrystalline silicon layer 300 in a subsequent step, it becomes highly difficult to precisely control the junction area between the p-type diffused region and the silicon epitaxial layer. Hence, the voltage $V_{BE}$ varies greatly across the base and the emitter in the inverse mode operation, making it difficult to adapt the device to an integrated circuit.

SUMMARY OF THE INVENTION

According to the present invention, a region where the base region comes into contact with the polycrystalline silicon is finely formed thereby maintaining high precision.

In the present invention, during the fabrication process a silicon nitride film is formed twice on the side surface of the convex silicon layer thereby forming a silicon opening which is maintained with high precision thereby decreasing the variance in the junction area relative to the polycrystalline silicon layer.

The semiconductor device according to the present invention comprises a semiconductor substrate of a first type of conductivity, a second region such as a buried 1 which is provided in the surface region of said substrate and which has a second type of conductivity opposite to said first type of conductivity, a first insulating film which is provided on the surface of said substrate and which has an opening on said third region, a first region formed as a mesa (island) which is provided in said opening and which consists of a first single crystalline semiconductor layer, a second insulating film which is provided on the side surface of said first mesa region, a second single crystalline or polycrystalline semiconductor layer which is formed on said first insulating film, which is located adjacent to said second insulating film, and which is in contact with a fourth region formed in the first region over a predetermined region inside the second insulating film, an insulating layer which is formed adjacent to said second single crystalline or polycrystalline semiconductor layer, a fifth region of the first type of conductivity provided in said first region, a sixth region of the second type of conductivity provided in said fifth region, and a third region of the first type of conductivity provided in said second single crystalline or polycrystalline semiconductor layer.

In other words, according to the structure of the present invention, a region of the first type of conductivity does not exist on the side surface of the convex single crystalline semiconductor layer or mesa since there exists an insulating film, and a region of the first type of conductivity is provided only along the periphery of the surface of the convex single crystalline semiconductor layer, the region of the first type of conductivity being electrically connected to the single crystalline or polycrystalline semiconductor layer.

The object of the present invention is to provide a method of fabricating semiconductor devices, which improves the aforementioned defects inherent in the conventional method of fabricating semiconductor devices, and in which an opening is formed in the side surface of the convex silicon layer or mesa maintaining high precision in order to decrease variance in the junction area relative to the polycrystalline silicon layer.

Another object of the present invention is to provide a semiconductor device consisting of a bipolar transistor which operates at high speeds, which features a high breakdown voltage, and which enables the size to be reduced in the vertical direction of the element and a method of fabricating the same, overcoming the aforementioned problems inherent in the conventional semiconductor devices.

These and other objects and many of the attendant advantages of this invention will be readily appreciated as the same becomes better understood by reference to the following detailed description when considered in connection with the accompanying drawings.

DETAILED DESCRIPTION OF THE INVENTION

The invention will now be described in detail by way of embodiments.

Figure 1A:
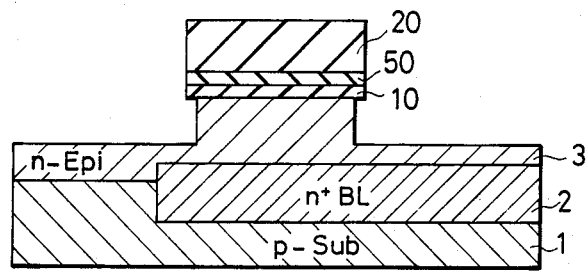
FIGS. 1A to 1F are section views illustrating conventional fabrication steps.
Figure 1B:
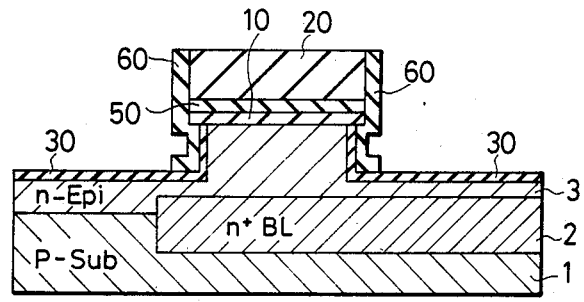
Figure 1C:
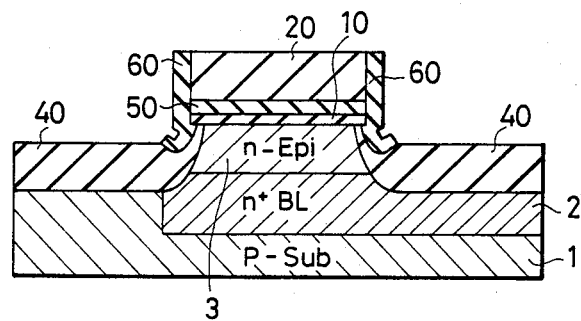
Figure 1D:
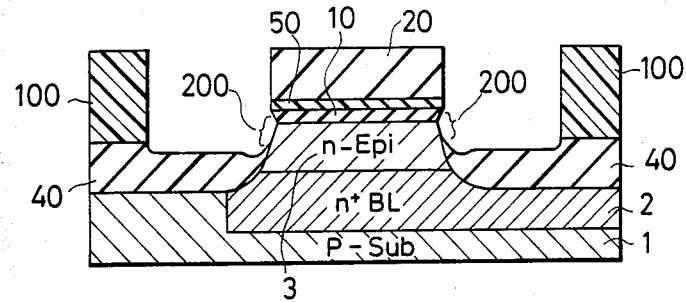
Figure 1E:
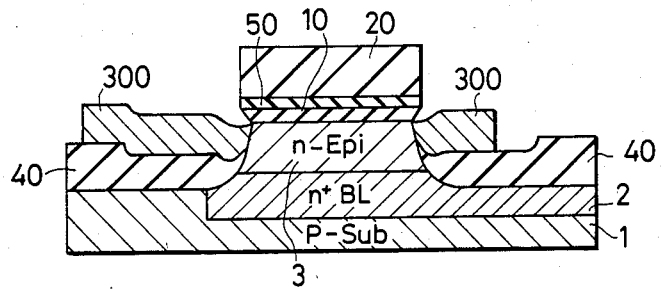
Figure 1F:
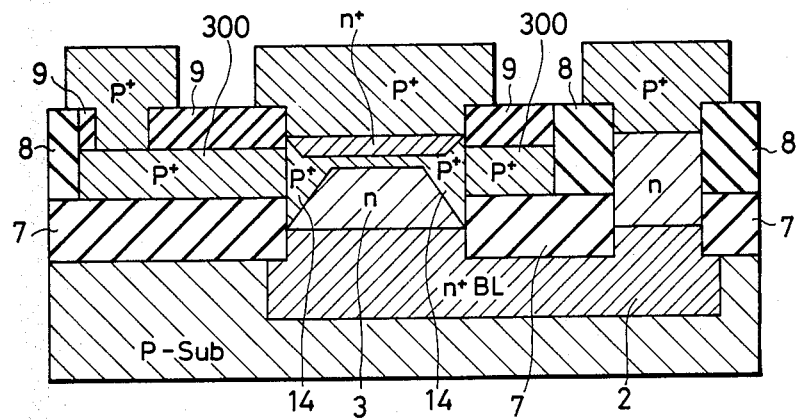
Figure 2A:
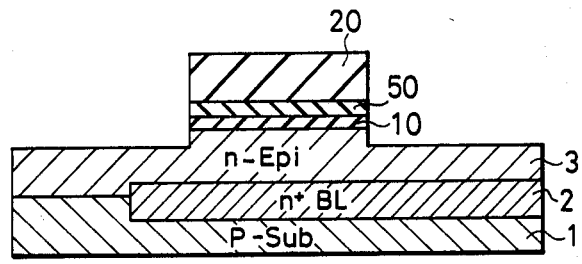
FIGS. 2A to 2F are section views illustrating a first embodiment of the present invention.

Embodiment 1:

FIGS. 2A to 2F illustrate a method of fabricating a semiconductor device according to an embodiment of the of the present invention. With reference to FIG. 2A, an n+-type buried layer 2 is formed on a p-type silicon substrate 1, an n-type silicon epitaxial layer 3 is grown thereon, a silicon dioxide film 10 is deposited on the whole surface thereof, an insulating film other than the silicon dioxide film, such as a silicon nitride film ($Si_3N_4$) 50 is deposited thereon, and another silicon dioxide film 20 is further deposited thereon, followed by patterning leaving three layers 10, 50 and 20 on the active region of the transistor. The silicon epitaxial layer is then etched using the three insulating layers 10, 50 and 20 as a mask, so that the active region assumes a convex shape. The junction area relative to the polycrystalline silicon on the side surface of the convex silicon layer is determined depending upon the depth of etching.

Figure 2B:
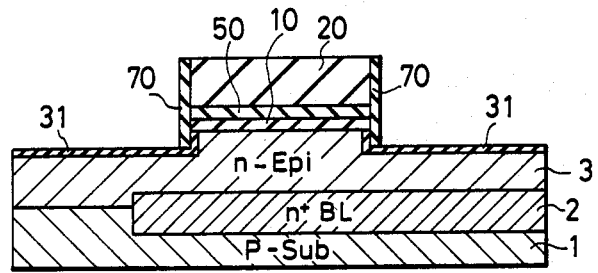

With reference to FIG. 2B, an oxide film 31 is formed by thermal oxidation, and a silicon nitride film is deposited on the whole surface, followed by selective etching so that the silicon nitride film 70 is left on the side surface only of the convex silicon layer.

Figure 2C:
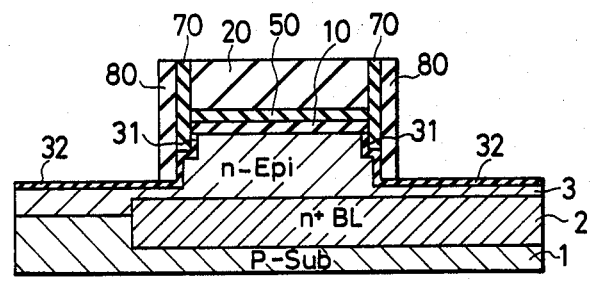

With reference to FIG. 2C, the silicon oxide film 31 is subjected to the etching so that the silicon epitaxial layer is exposed on the portions other than the convex portion. The silicon epitaxial layer is then subjected to the etching and is thermally oxidized to form an oxide film 32. Thereafter, silicon nitride is deposited on the whole surface, and a silicon nitride film 80 is left on the side surface only of the convex silicon layer by selective etching. The silicon nitride films 70 and 80 are formed in double-layer structure on the side surface of the silicon oxide film 31, and the silicon nitride film 80 is formed in a single-layer structure on the side surface of the silicon dioxide film 32.

Figure 2D:
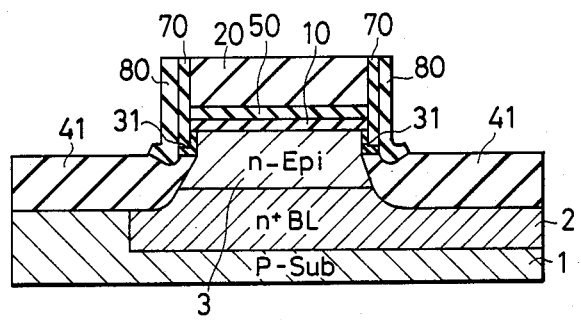

With reference to FIG. 2D, an oxide film 41 is formed by the thermal oxidation. In the portion where the silicon nitride films 70 and 80 are left in two layers on the side surface of the convex silicon layer, the oxide film grows less than that on the portion where the silicon nitride film 80 is left in one layer, and the thickness of the oxide film 31 remains almost unchanged.

Figure 2E:
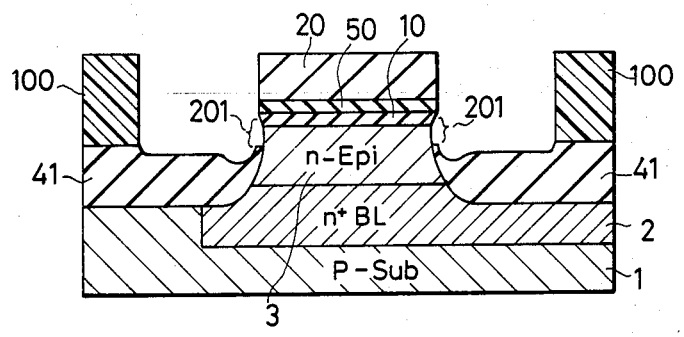

With reference to FIG. 2E, the silicon nitride films 70 and 80 are removed and, then, a photoresist is applied followed by patterning (100), in order to subject the silicon oxide film 41 to the etching. In this case, an opening 201 is formed at an upper portion of the convex silicon layer. Here, though the silicon oxide film 41 is etched by using a photoresist, the patterning need not be particularly effected for the purpose of etching. In the step of forming the opening, the silicon oxide film 41 under the opening has a thickness greater than that of the silicon oxide film 31 due to the thermal oxidation of FIG. 2D, and only a portion of the silicon oxide film 31 can be selectively opened owing to the difference in the thickness.

Figure 2F:
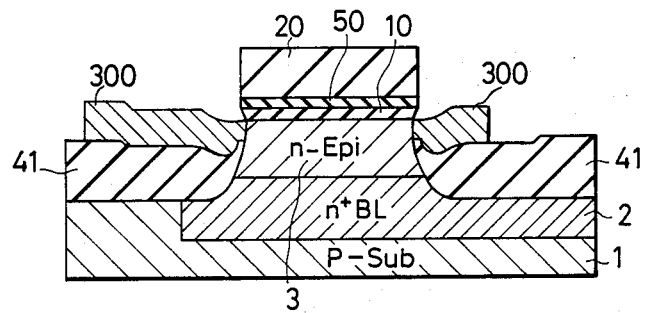

With reference to FIG. 2F, the polycrystalline silicon layer is deposited on the whole surface followed by patterning (300), so that only the side surface of the convex epitaxial layer or mesa is brought into contact with the polycrystalline silicon layer.

Through the above-mentioned steps, it is possible to highly precisely control the area of the side surface of the convex silicon layer or mesa to which the polycrystalline silicon layer comes into contact. That is, the junction area is determined by the etching depth of the silicon layer in FIG. 2A. In the subsequent steps, the junction area is maintained covered with the silicon dioxide film and the silicon nitride film. Further, the silicon dioxide film can be selectively removed by etching from this portion.

Figure 3:
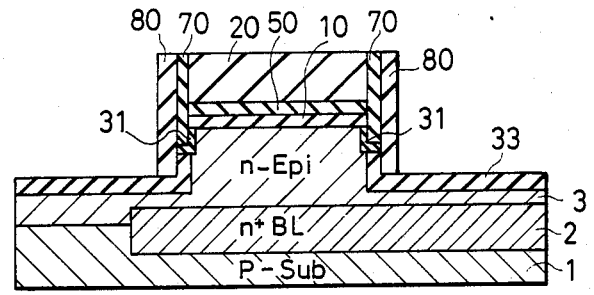
FIG. 3 is a section view illustrating a second embodiment of the present invention.

Embodiment 2:

FIG. 3 shows a method of fabricating a semiconductor device according to the present invention, wherein the oxide film formed by the step of thermal oxidation of FIG. 2C has a thickness more than two times that of the oxide film 31, thereby to constitute an oxide film 33. Other steps are the same as those shown in FIGS. 2A to 2F. When the silicon dioxide film is removed by etching (FIG. 2E) to bring the polycrystalline silicon layer into contact with the side surface of the convex silicon layer in accordance with the method of this embodiment, the oxide film has a reduced thickness on a portion where the opening is to be formed, and increased degree of selectivity can be provided.

Figure 4:
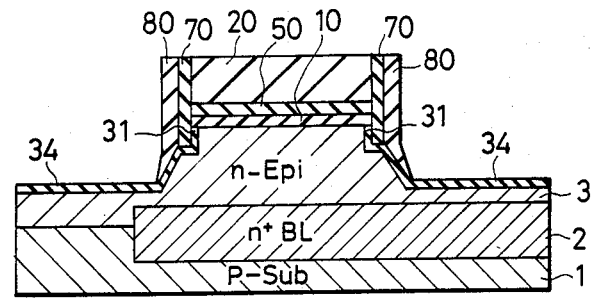
FIG. 4 is a section view illustrating a third embodiment of the present invention.

Embodiment 3:

FIG. 4 shows a method of fabricating a semiconductor device according to the present invention, wherein a lower portion of the convex silicon layer is tapered in the step of etching silicon of FIG. 2C. Other steps are the same as those shown in FIGS. 2A to 2F. According to the method of this embodiment, stress is not concentrated in the step of forming the thermally oxidized film 41 since the convex silicon layer is tapered, and defect is prevented from developing. Further, in selectively removing the silicon nitride film 80 by etching, the thickness of the silicon nitride film 80 decreases toward the lower end owing to the convex silicon layer that is tapered. Therefore, bird's beak of the oxide film reaches the lower end of the oxide film 31 due to the subsequent thermal oxidation and assumes a thickness greater than that of the oxide film 31. Therefore, the selectivity can be increased in the subsequent step (FIG. 2E) of removing the silicon dioxide film by etching.

The aforementioned embodiments 1 to 3 can be realized even when other semiconductors such as GaAs and the like are used. In the above embodiments, furthermore, the conductivity types, i.e., p-type conductivity and n-type conductivity, may be reversed as a matter of course.

According to the conventional art explained in conjunction with FIGS. 1A to 1F, the polycrystalline semiconductor layer 300 doped with p-type impurities is brought into contact with the side surface of the convex semiconductor or mesa, a $p^+$-type region 14 is isotropically diffused from the side surface of the n-type epitaxial layer 3 and is brought close to the $n^+$-type buried layer 2, causing the breakdown voltage to decrease between the base and the collector, and permitting the junction capacity to increase thereby impairing the high-speed operation. This problem becomes more conspicuous as the thickness of the n-type epitaxial layer 3 is further reduced.

The embodiments of the present invention that will be described hereinbelow are to solve the above-mentioned problem.

Figure 5:
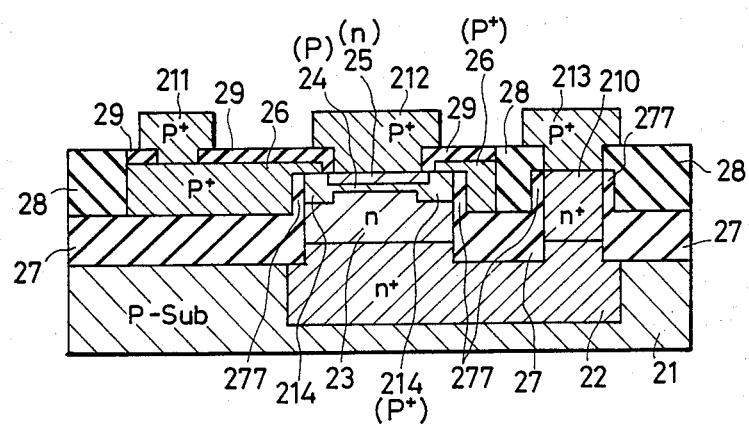
FIGS. 5 and 6A to 6E are section views illustrating a fourth embodiment of the present invention.

Embodiment 4:

FIG. 5 illustrates in cross section the structure of a semiconductor device according to a fourth embodiment of the present invention.

This embodiment deals with a bipolar transistor, in which an insulating film 277 is provided on the side surface of a convex single crystalline semiconductor layer or mesa 23, and polycrystalline semiconductors 26 are connected only through a peripheral portion of the surface of the convex single crystalline semiconductor layer or mesa 23. Therefore, a $p^+$-type region 214 diffused from the polycrystalline semiconductor layer 26 which has been doped with impurities in advance can be formed near the surface only, and does not approach an $n^+$-type buried layer 22. Accordingly, the parasitic capacitance decreases and the speed of operation increases. The breakdown voltage increases, too. Further, since the side surfaces of the $p^+$-type region 214 are brought into contact with the insulating film 277, the junction exists on the bottom surface only, contributing to decreasing the capacitance. With this structure, furthermore, one time of photo step for determining the convex single crystalline semiconductor layer 23, helps determine the active region as well as diffused layers 24, 25, 214 inside thereof and an electrode 212, contributing to reducing the area of the element.

This structure makes it possible to broaden the gap between the buried layer of the second type of conductivity having a high concentration and the region of the first type of conductivity connected to the single crystalline or polycrystalline semiconductor layer, to decrease the capacitance between the base and the collector of the bipolar transistor, and to increase the speed of operation. The breakdown voltage can be increased, too. According to this embodiment, furthermore, the active region and the isolated regions can be determined by one time of photo step, contributing to increasing the degree of integration of the elements.

FIGS. 6A to 6E are section views illustrating the steps for fabricating the bipolar transistor of the fourth embodiment shown in FIG. 5. The fabricating steps will now be described in conjunction with the drawings.

Figure 6A:
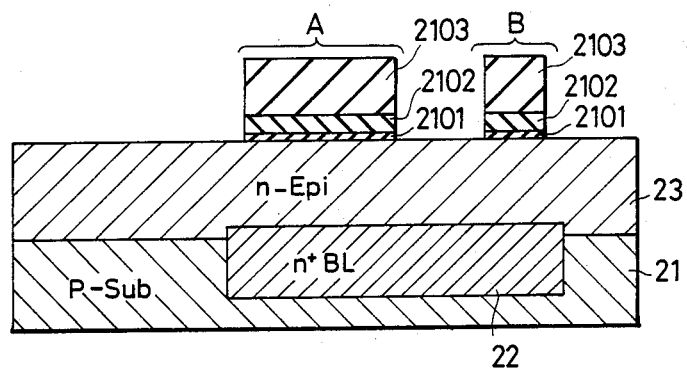

With reference to FIG. 6A, an $n^+$-type buried layer 22 is formed on a p-type silicon substrate 2, an n-type silicon epitaxial layer 23 is grown maintaining a thickness of 1 μm and a resistivity of about one ohm·cm. Then, a silicon dioxide film 2101, an insulating film other than the silicon dioxide film, such as a silicon nitride film ($Si_3N_4$) 2102, and another silicon dioxide film 2103 are deposited on the whole surfaces, followed by patterning to leave the three layers 2101, 2102 and 2103 on only the active region A and the collector electrode take-out region B of the transistor.

Figure 6B:
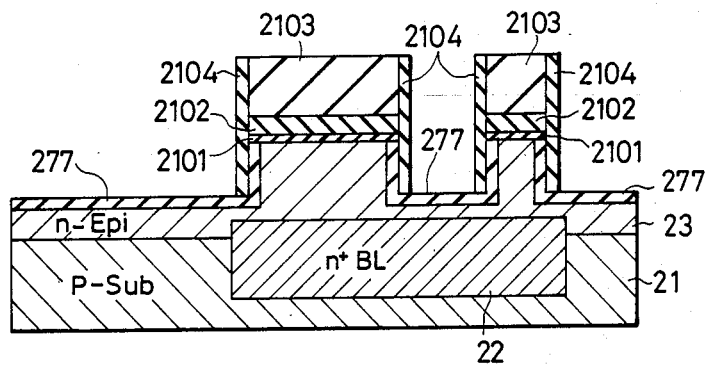

With reference to FIG. 6B, the silicon epitaxial layer is etched to a depth of about 0.5 μm by using the three insulating films 2101, 2102 and 2103 as a mask, so that the active region and the collector electrode take-out region will assume the convex shape. Thereafter, a silicon dioxide film 277 is formed by thermal oxidation, a silicon nitride film ($Si_3N_4$) is deposited on the whole surface, and the silicon nitride film 2104 is left only on the side surface of the convex silicon layer by selective etching. Here, the oxide film 277 has a thickness two to three times as great as that of the oxide film 2101.

Figure 6C:
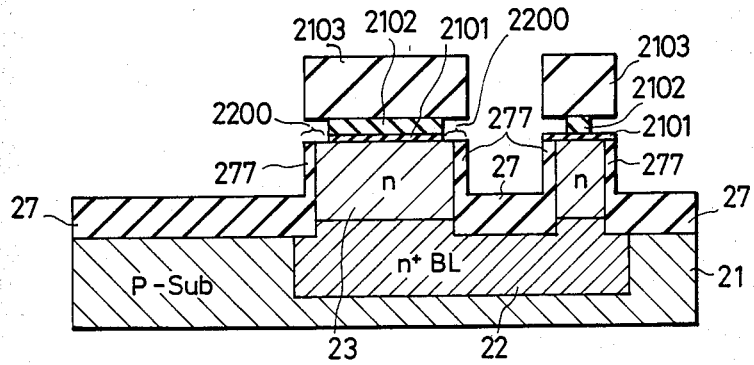

With reference to FIG. 6C, an oxide film 27 is formed by the thermal oxidation. Thereafter, the silicon nitride film 2104 is removed. At this moment, the sides of the silicon nitride film 2102 are removed by etching so that the silicon nitride film 2102 will enter inwardly from the ends of the surface of the convex silicon layer. Then, the oxide film is removed by etching by a thickness that corresponds to the oxide film 2101, to form an opening 2200 of silicon only at the ends of the surface of the convex silicon layer. Here, though a mask is used for the collector electrode take-out region to leave the oxide film 2101, the patterning need not be particularly effected for the purpose of etching.

Figure 6D:
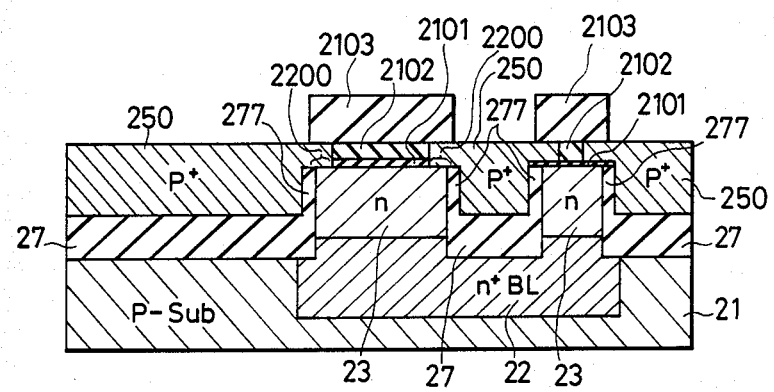

With reference to FIG. 6D, a polycrystalline silicon layer is formed on the whole surface, followed by patterning so that only the end surface 2200 of the convex epitaxial layer or mesa is brought into contact with the polycrystalline silicon layer 250.

Figure 6E:
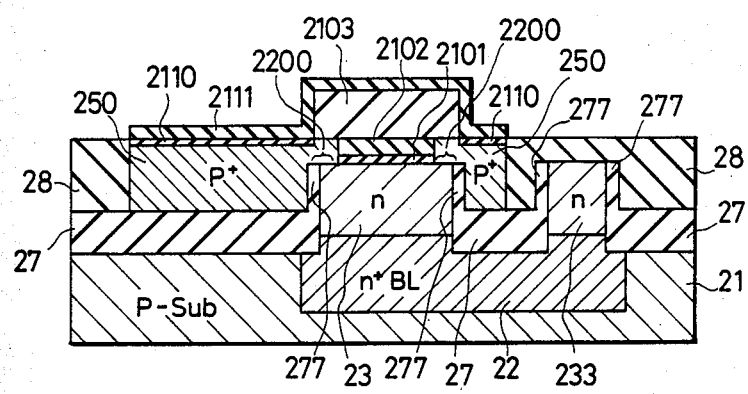

With reference to FIG. 6E, a silicon dioxide film 2110 and a silicon nitride film 2111 are formed on the whole surface, followed by patterning. Then, using the thus patterned two insulating films 2110 and 2111 as a mask, part of the polycrystalline silicon is thermally oxidized to form an oxide film 28. Then, $n^+$-type impurities are added at a high concentration to a collector electrode takeout semiconductor layer 233.

Thereafter, the silicon oxide film 2110 and the silicon nitride film 2111 are removed, p-type impurities are diffused into a polycrystalline silicon layer 250 to form a p-type diffused layer 214, followed by thermal oxidation to form an oxide film 29. Then, a base region 24 and an emitter region 25 of the transistor are formed by a customary method, contact holes are formed in the oxide film, and electrodes 211, 212 and 213 are formed by vaporization to form an element as shown in FIG. 5.

In the foregoing were mentioned the fourth embodiment and the fabricating method according to the present invention. With the above fabricating method, the element isolating region through up to the emitter electrode can be formed all in a self-aligned manner through one time of the photo step. Further, the width of the external base region is determined by the amount of side etching of the silicon nitride film, and can be decreased to 0.2 μm or smaller.

Embodiment 5:

In the foregoing was described a first fabricating method according to the present invention. Another method of fabricating the structure of the present invention are shown in FIGS. 7A to 7C.

Figure 7A:
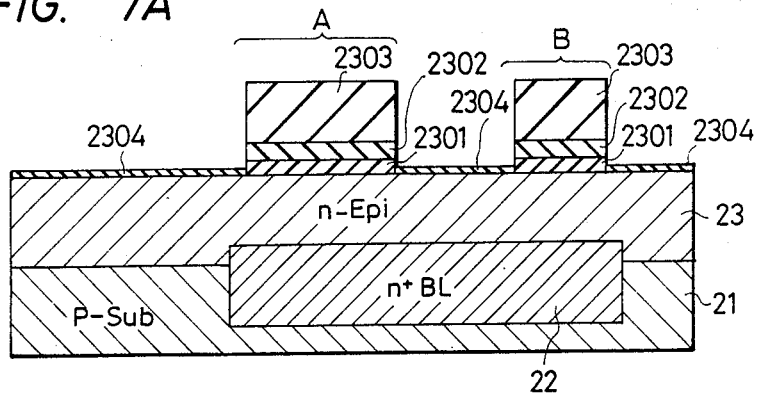
FIGS. 7A to 7C are section views illustrating a fifth embodiment of the present invention.

With reference to FIG. 7A, three layers 2301, 2302 and 2303 are formed only on the active region A and on the collector electrode take-out region B of the transistor through the same steps as those of up to FIG. 6A, and a silicon oxide film 2304 is formed by the thermal oxidation. Here, the oxide film 2304 has a thickness which is one-half to one-third that of the oxide film 2301.

Figure 7B:
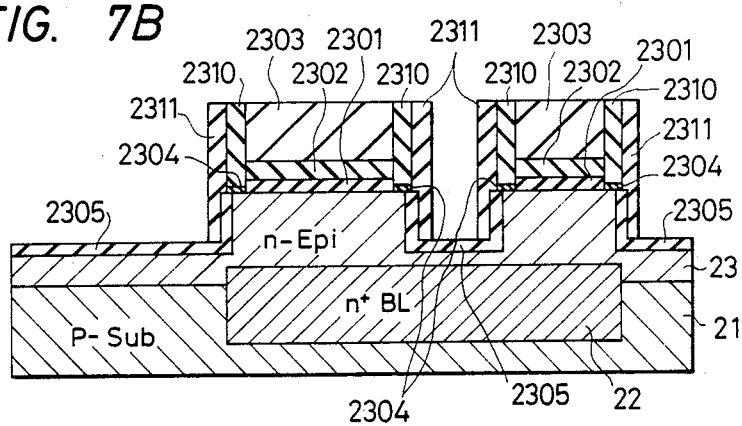

With reference to FIG. 7B, a silicon nitride film is deposited on the whole surface, and the silicon nitride film 2310 is left only on the side surfaces of the three layers 2301, 2302 and 2303 by selective etching. The oxide film 2304 is so removed by etching that it is left only on the lower portion of the silicon nitride film 2310 formed along the periphery of the three layers 2301, 2302 and 2303. Using the three layers 2301, 2302, 2303 and the silicon nitride film 2310 as masks, the silicon epitaxial layer is etched to a depth of about 0.5 μm, so that the active region and the collector electrode take-out region assume the convex shape. Then, a silicon oxide film 2305 is formed by the thermal oxidation, a silicon nitride film is deposited on the whole surface, and the silicon nitride film 2311 is left only on the side surfaces of the convex silicon layer by selective etching. Here, the oxide film 2305 has a thickness the same as that of the oxide film 2301, which is about two to three times as great as the thickness of the oxide film 2304.

Figure 7C:
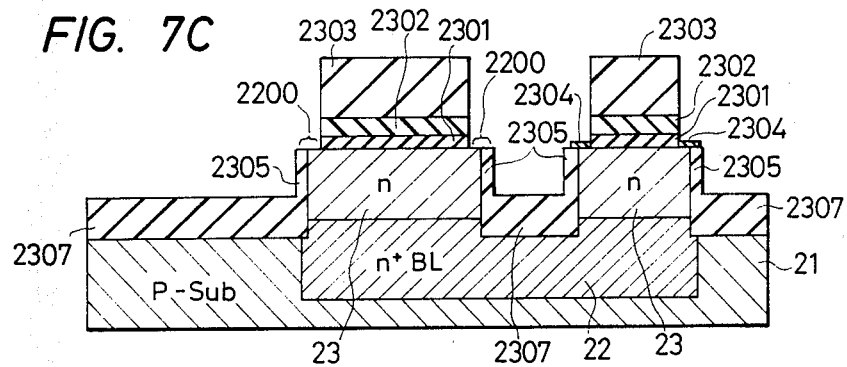

With reference to FIG. 7C, an oxide film 2307 is formed by the thermal oxidation, and the silicon nitride films 2310 and 2311 are removed. Thereafter, the oxide film is removed by etching by a thickness that corresponds to the oxide film 2304, and an opening 2200 is formed only at the ends of the surface of the convex silicon layer or mesa.

According to this fabricating method, the width of the opening 2200 is determined by the thickness of the silicon nitride film 2310, and can, hence, be controlled maintaining high precision.

After the step of FIG. 7C, the same steps as those of FIGS. 6D and 6E are effected to form the element shown in FIG. 5.

Figure 8:
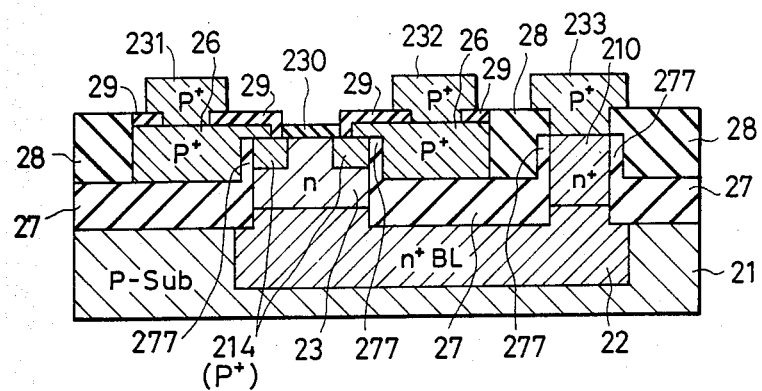
FIG. 8 is a section view illustrating a sixth embodiment of the present invention.

Embodiment 6:

FIG. 8 is a section view showing the structure of a lateral bipolar transistor to which the present invention is adapted. Electrodes of emitter and collector regions 214 are taken out through polycrystalline semiconductor layers 26 surrounded by insulating films 277, 27, 28 and 29, and wherein ends of the surface of the convex silicon layer or mesa are connected to single crystalline silicon of the polycrystalline semiconductor layers 26. This makes it possible to reduce the junction capacitance between the emitter and the collector, to reduce the thickness of the single crystalline semiconductor layer, and, hence, to realize a small transistor that operates at high speeds. In FIG. 8, a base electrode 233 is taken out via the n+-type buried layer 22. As shown in FIG. 5, however, the n-type diffused layer 25 may be formed on the surface of the convex silicon layer or mesa to use it as a base electrode. Then, the n+-type buried layer needs be formed only under the convex silicon layer, to reduce the junction capacitance between the n+-type buried layer and the substrate and to realize the transistor in a small size.

Figure 9:
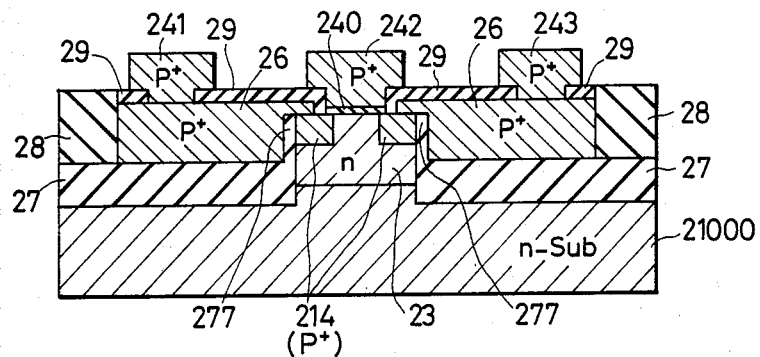
FIG. 9 is a section view illustrating a seventh embodiment of the present invention.

Embodiment 7:

FIG. 9 shows in cross section the structure of a MOS to which the present invention is adapted. In this case, the source and drain regions 214 are formed maintaining a very small width and are self-aligned. In FIG. 9, an n-type epitaxial layer 23 is provided on an n-type silicon substrate 21000. However, the n-type epitaxial layer or mesa 23 is not particularly required, but the n-type silicon substrate 21000 only may be utilized.

Alternatively, the n+-type buried layer may be provided on a p-type silicon substrate as in FIG. 5 of the drawings.

Figure 10:
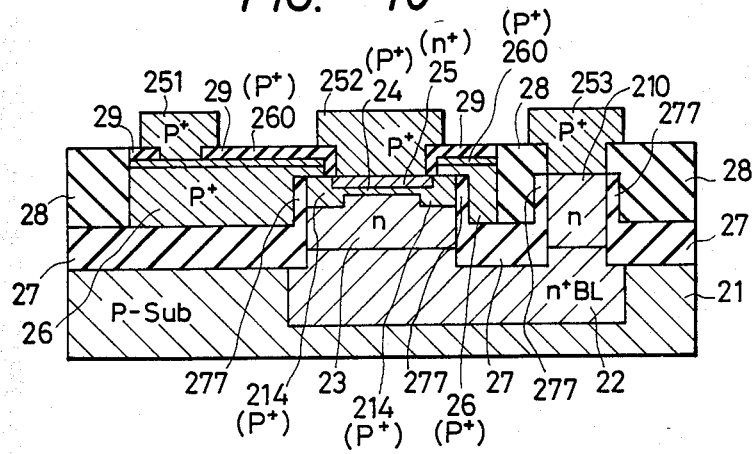
FIG. 10 is a section view illustrating an eighth embodiment of the present invention.

Embodiment 8:

With reference to FIG. 10, a metal or a metal compound (WSi$_2$) 260 is formed on the polycrystalline silicon layer to decrease the wiring resistance, in order to form a transistor that operates at high speeds and that consumes a small amount of electric power.

Figure 11:
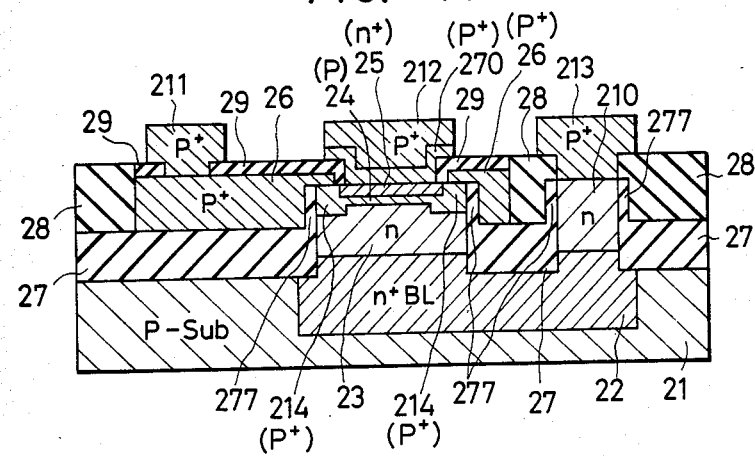
FIG. 11 is a section view illustrating a ninth embodiment of the present invention.

Embodiment 9:

With reference to FIG. 11 which illustrates the structure of the device of the present invention, a polycrystalline silicon layer 270 is provided on the emitter to prevent metal atoms in the electrode 212 from infiltrating into the base region 24. This permits the depth of the emitter region 25 to be decreased (0.1 to 0.2 μm), making it possible to form a transistor that operates at high speeds and that is small in size.

In the aforementioned embodiments 4 to 9, some or all of the combinations thereof may be employed. The device of the present invention can also be realized even by using other semiconductors such as GaAs and the like. In these embodiments, furthermore, the conductivity types, i.e., p-type and n-type may be reversed, as a matter of course.

According to the conventional art mentioned in conjunction with FIGS. 1A to 1F, the polycrystalline semiconductor layer 300 doped with p-type impurities contacts the side surfaces of the convex semiconductor layer or mesa, and the p+-type region 14 is isotropically diffused from the side surface of the n−-type epitaxial layer 3 to approach the n+-type buried layer 2. Therefore, the junction capacitance increases between the base and the collector to impair the high-speed operation. This problem becomes more conspicuous as the thickness of the n−-type epitaxial layer 3 decreases.

This embodiment is to provide a bipolar transistor which operates at high speeds, improving the aforementioned problems.

In order to achieve the above object, the following embodiment comprises a semiconductor substrate of a first type of conductivity, a first region which is provided on the surface region of said substrate and which has a second type of conductivity opposite to said first type of conductivity, a first insulating film which is provided on the surface of said substrate and which has an opening on said first region, a second region or mesa which is provided on said opening and which consists of a single crystalline semiconductor layer having the second type of conductivity, a second insulating film provided on the side surfaces of the second region, a second single crystalline or polycrystalline semiconductor layer which is provided on said first insulating film adjacent to said second insulating film and which is in contact with a corner portion, having top and side portions, near the surface of the second region over a region of a predetermined width, an insulating layer which is provided adjacent to said second single crystalline or polycrystalline semiconductor layer, a third region of the first type of conductivity which is provided in the upper corner portion of the second region that is electrically connected to said single crystalline or polycrystalline semiconductor layer, a fourth region of the first type of conductivity which is provided in the second region electrically connected to said third region, a fifth region of the second type of conductivity provided in said fourth region, and a sixth region of the first type of conductivity provided in said second single crystalline or polycrystalline semiconductor layer, wherein the impurity concentration in said third region is higher than that of said fourth region, and a position of junction between said third region and said second region is closer to the surface than a position of junction between said fourth region and said second region.

In other words, an insulating film is formed on the side surfaces of a convex single crystalline semiconductor layer or mesa, a single crystalline or polycrystalline conductive layer upper is connected to the corner portion on both the top and side surface near the surface of the convex single crystalline semiconductor layer or mesa maintaining a predetermined width, and the junction surface between the second region and the third region of the first type of conductivity which is electrically connected to the single crystalline or polycrystalline conductive layer and which has a high impurity concentration, is located closer to the surface than the junction surface between the second region and the fourth region.

Owing to the above-mentioned structure, the gap between the buried layer (first region) of the second type of conductivity and the third region of the first type of conductivity, which is connected to the second single crystalline or polycrystalline semiconductor layer and which has a high impurity concentration, can be selected to be greater than the gap between the first region and the fourth region of the first type of conductivity which has a low impurity concentration, and whereby the capacitance can be decreased between the base and the collector of the bipolar transistor to increase the speed of operation.

Figure 12:
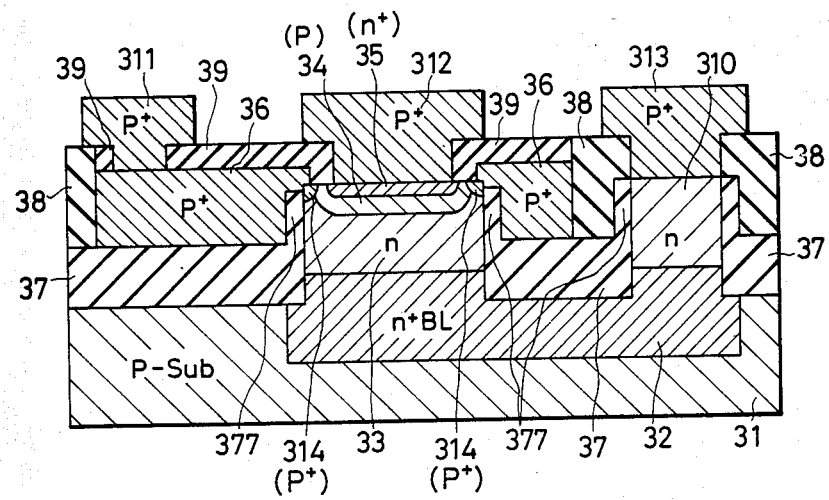
FIG. 12 to 14 are section views illustrating a tenth embodiment of the present invention.

Embodiment 10:

FIG. 12 is a section view showing the structure of a semiconductor device according to a tenth embodiment of the present invention.

This embodiment deals with a bipolar transistor, wherein an insulating film 377 is provided on the side surface of a convex single crystalline semiconductor layer or mesa 33, a polycrystalline semiconductor layer 36 is connected to a corner portion near the surface of the convex single crystalline semiconductor relayer 33 over a region of a predetermined width which is as small as 0.1 $\mu$m or less, and the thickness of the polycrystalline semiconductor layer is reduced near the connecting portion to restrain the diffusion from the polycrystalline semiconductor layer 36 which has been doped with impurities in advance. Further, the distance between a $p^+$-type region 314 and an $n^+$-type buried layer 32 is greater than the distance between the $p^+$-type region 314 and a $p^-$-type region 34. The junction capacity varies in proportion to an inverse number of the width of a depletion layer under the condition where a reverse bias is applied. Therefore, the junction capacity decreases with the increase in the width of the depletion layer. Here, the width of the depletion layer is determined by the concentration of the diffused layer which forms the junction. In the junction between a high-concentration layer and a low-concentration layer, the depletion layer extends toward the side of the low-concentration layer. If a capacitance between the collector and the base is taken into consideration, the depletion layer extends toward the side of the $n^-$-type epitaxial layer 33 in the junction between the $p^+$-type external base layer 314 of a high concentration and the $n^-$-type epitaxial layer 33 of a low concentration. When the $n^+$-type buried layer 32 of the high concentration is reached, however, the depletion layer does not extend any more, and the thickness of the $n^-$-type epitaxial layer 33 between the $p^+$-type external base layer 314 and the $n^+$-type buried layer 32 becomes nearly equal to the width of the depletion layer. Therefore, the junction capacitance between the $p^+$-type external base layer 314 and the $n^-$-type epitaxial layer 33 is determined by the thickness of the $n^-$-type epitaxial layer 33 under the $p_+$-type external base layer 314. To reduce the junction capacitance, the depth of diffusion of the $p^+$-type external base layer 314 must be decreased. In the junction between a $p^-$-type intrinsic base layer 34 of a low concentration and the $n^-$-type epitaxial layer 33, on the other hand, the depletion layer extends toward both sides. Compared with the case of the $p^+$-type external base layer 314, therefore, the junction capacitance is not much affected by the thickness of the $n^-$-type epitaxial layer 33 under the $p^-$-type intrinsic base layer 34. Therefore, the high-speed operation is not impaired even when the $p^-$-type intrinsic base layer is formed having a thickness deeper than the $p^+$-type external base layer 314. Therefore, development of defective operation such as leakage of current between the emitter and the collector can be restrained, and high yields can be realized.

FIGS. 13A to 13E are section views illustrating the steps for fabricating a bipolar transistor of the tenth embodiment shown in FIG. 12. The fabricating steps will now be described in conjunction with the drawings.

Figure 13A:
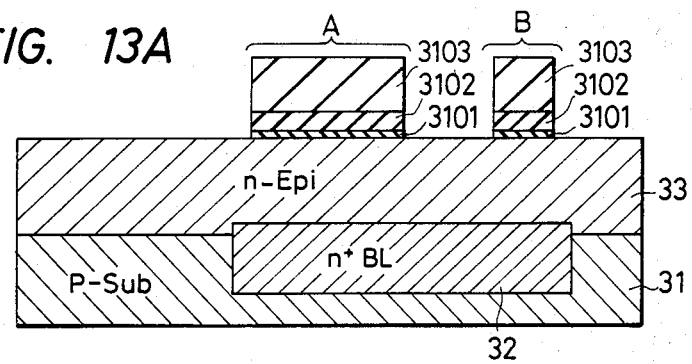

With reference to FIG. 13A, an $n^+$-type buried layer 32 is formed on a p-type silicon substrate 31, an n-type silicon epitaxial layer 33 is grown maintaining a thickness of 1 $\mu$m and a resistivity of 1 ohm·cm, and a silicon dioxide film 3101, an insulating film other than the silicon dioxide film, such as a silicon nitride film ($Si_3N_4$) 3102 as well as another silicon dioxide film 3103 are deposited on the whole surface, followed by patterning to leave the three layers 3101, 3102 and 3103 on only the active region A and the collector electrode take-out portion B of the transistor.

Figure 13B:
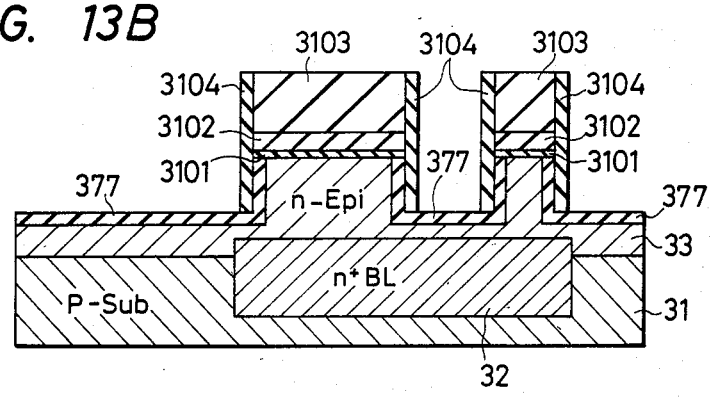

With reference to FIG. 13B, the silicon epitaxial layer is etched to a depth of about 0.5 $\mu$m using the three insulating films 3101, 3102 and 3103 as a mask, so that the active region and the collector electrode take-out region assume a convex shape. Thereafter, a silicon dioxide film 377 is formed by the thermal oxidation, a silicon nitride film ($Si_3N_4$) is deposited on the whole surface, and the silicon nitride film 3104 is left only on the side surfaces of the convex silicon layer by selective etching. Here, the oxide film 377 has a thickness about two to three times as great as that of the oxide film 3101.

Figure 13C:
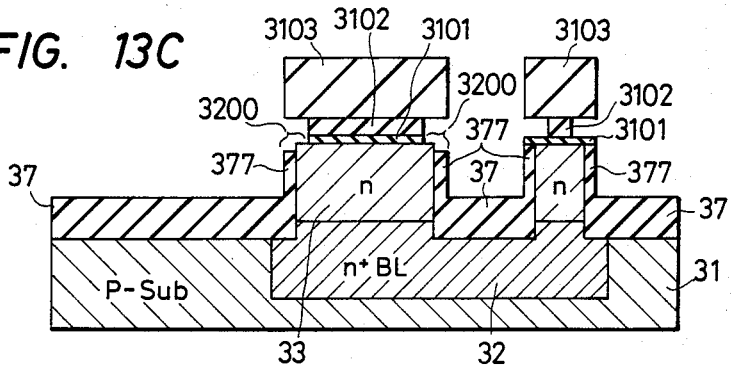

With reference to FIG. 13C, an oxide film 37 is formed by the thermal oxidation. Then, the silicon nitride film 3104 is removed. At this moment, the sides of the silicon nitride film 3102 are removed by etching so that the silicon nitride film 3102 will enter to the inside from the ends of the surface of the convex silicon layer or mesa. Then, the oxide film is removed by etching by a thickness corresponding to the oxide film 3101, and an opening 3200 of silicon is formed only at a corner portion near the surface of the convex silicon layer. Though the oxide film 3101 is left on the collector electrode take-out portion by using a mask, the patterning need not necessarily be effected for the purpose of etching.

Figure 13D:
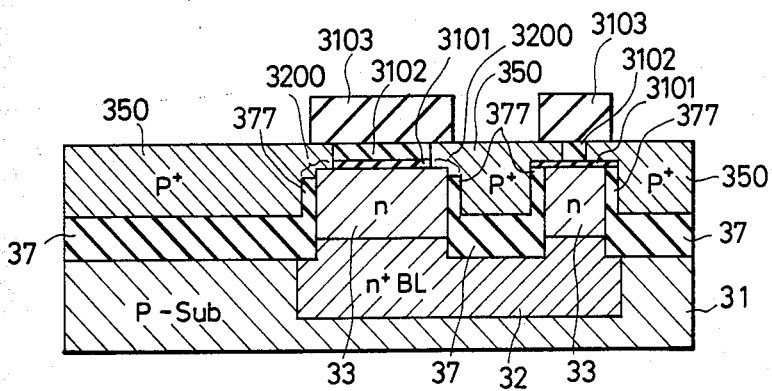

With reference to FIG. 13D, a ploycrystalline silicon layer is formed on the whole surface, followed by patterning so that only the end surface 3200 of the convex epitaxial layer or mesa is brought into contact with the polycrystalline silicon layer 350.

Figure 13E:
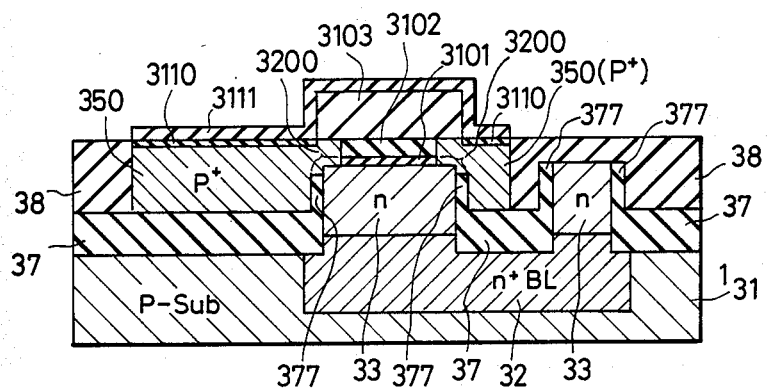

With reference to FIG. 13E, a silicon dioxide film 3110 and a silicon nitride film 3111 are formed on the whole surface, and are subjected to the patterning. Using the thus patterned two insulating films 3110 and 3111 as a mask, part of the polycrystalline silicon layer is thermally oxidized to form an oxide film 38. Thereafter $n^+$-type impurities are added to the collector electrode take-out semiconductor layer 333 at a high concentration.

Then, the silicon dioxide film 3110 and the silicon nitride film 3111 are removed, p-type impurities are diffused into the polycrystalline silicon layer 350 to form a $p^+$-type diffused layer 314, followed by the thermal oxidation to form an oxide film 39. Next, a base region 34 and an emitter region 35 of a transistor are formed by a customary method, contact holes are formed in the oxide film, and electrodes 311, 312 and 313 are formed by vaporization thereby to form the element as shown in FIG. 12.

In the foregoing were described the tenth embodiment of the present invention and a fabricating method according thereto. According to such a fabricating method, the isolating region of an element through up to an emitter electrode can be formed in a self-aligned manner through one time of the photo step. Further, the outer base region is formed maintaining a constant width at the corner portion near the surface of the convex silicon layer or mesa.

Figure 14:
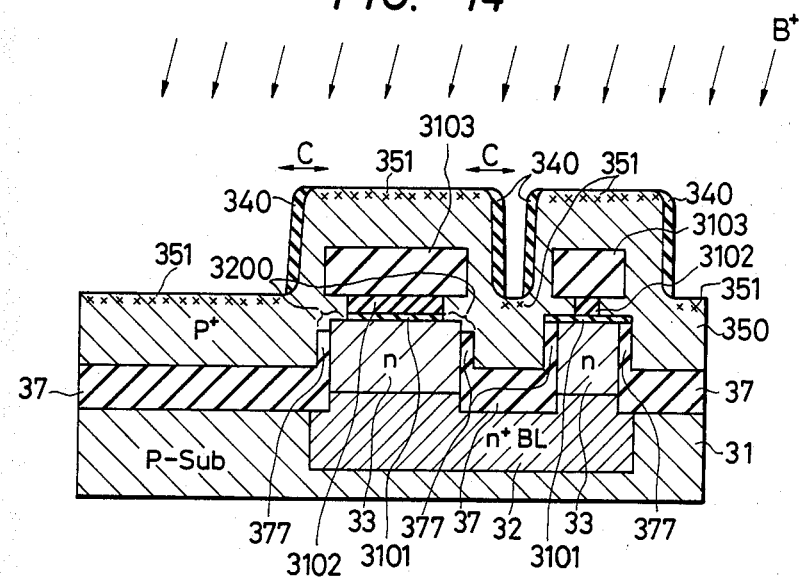

In the foregoing were described major portions of the present invention. FIG. 14 shows a method of decreasing the diffusion of the $p^+$-type outer base layer in fabricating the structure according to the present invention. Namely, FIG. 14 shows a step between the step of FIG. 13C and the step of FIG. 13D, and wherein after a polycrystalline silicon layer is formed on the whole surface, an insulating layer is deposited on the whole surface, and the insulating layer 340 is left on the vertically rising portion of the polycrystalline silicon layer by selective etching. Immediately thereafter, p-type impurities (such as boron ions $B^+$) are injected into the polycrystalline silicon layer 350. According to this method, an impurity-injected layer 351 is formed at a position separated away from the convex silicon layer by the thickness (distance C) of the polycrystalline silicon layer 350 and the insulating layer 340. Owing to this offset effect, the depth of the $p^+$-type diffused layer 314 can be reduced.

Figure 15:
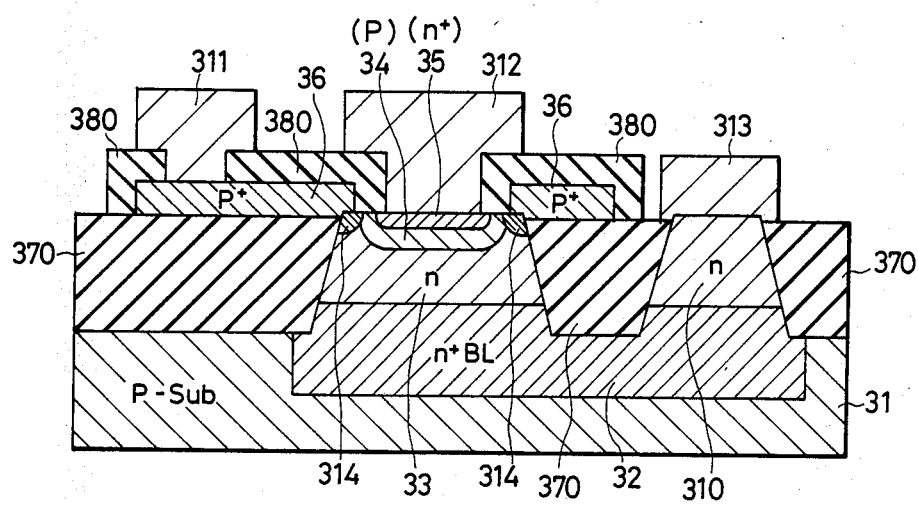
FIG. 15 is a section view illustrating an eleventh embodiment of the present invention.

Embodiment 11:

FIG. 15 shows in cross section the structure of a semiconductor device according to an eleventh embodiment of the present invention. In this embodiment, an insulating film 370 is formed adjacent to the convex single crystalline semiconductor layer or mesa 33 nearly in flush with the surface of the convex single crystalline semiconductor layer or mesa, and a polycrystalline semiconductor layer 36 is connected to the corner near the surface of the convex single crystalline semiconductor layer 33 maintaining a constant width. According to this structure, there exists the insulating film 370 having a large thickness between the polycrystalline semiconductor layer 36 and the convex single crystalline semiconductor layer 33, and the MOS capacitance therebetween can be decreased compared with that of the tenth embodiment (FIG. 12).

Figure 16:
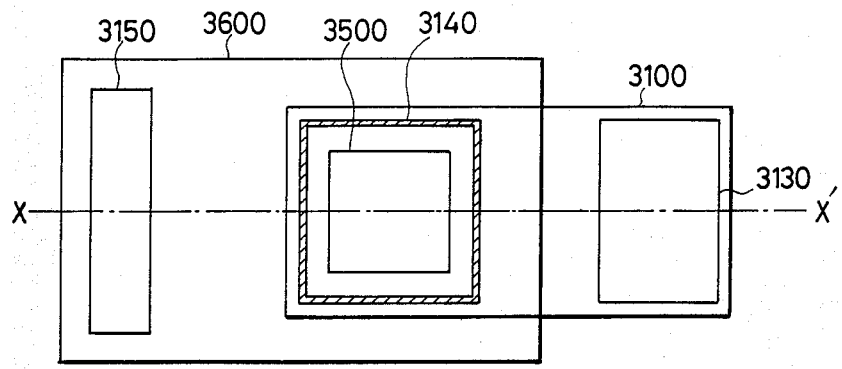
FIG. 16 is a plan view showing fourth, sixth, seventh, eighth, ninth, tenth and eleventh embodiments of the present invention.

FIG. 16 is a plan view of the semiconductor device of the present invention, wherein the cross section along the line X-X' corresponds to those of FIGS. 5, 8, 9, 10, 11, 12 and 15. There is provided the $p^+$-type diffused layer region 3140 of a constant width at the corner portion near the surface of the convex single crystalline semiconductor layer, and there is further provided the $n^+$-type diffused layer region 3500 inside thereof maintaining an equal distance from the $p^+$-type diffused layer region 3140.

Figure 17:
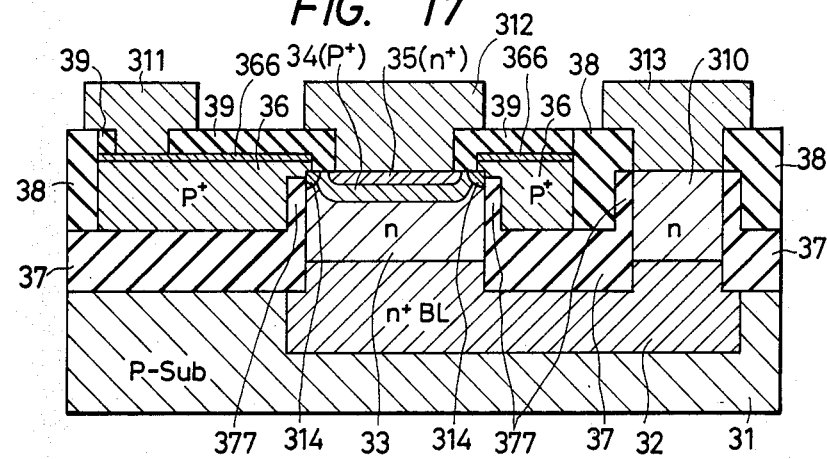
FIG. 17 is a section view illustrating a twelfth embodiment of the present invention.

Embodiment 12:

FIG. 17 shows the structure of a device according to the present invention, wherein a metal or a metal compound 366 is formed on the polycrystalline semiconductor layer 36 to decrease the wiring resistance, thereby to form a transistor that operates at high speeds.

Figure 18:
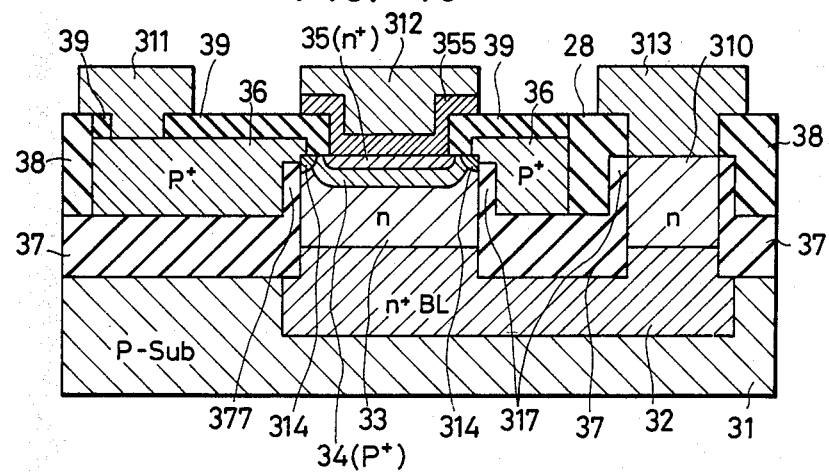
FIG. 18 is a section view illustrating a thirteenth embodiment of the present invention.

Embodiment 13:

FIG. 18 illustrates the structure of a device according to the present invention, wherein a polycrystalline semiconductor layer 355 is provided on the emitter to prevent metal atoms in the electrode 312 from infiltrating into the base region 34. Owing to this structure, the thickness of the emitter region 35 can be reduced (0.1 to 0.2 $\mu$m) to realize a transistor that operates at high speeds.

In the aforementioned embodiments 10 to 13, some or all of the combinations thereof may be employed. The device of the present invention can also be realized even by using other semiconductors such as GaAs and the like. In these embodiments, furthermore, the conductivity types, i.e., p-type and n-type may be reversed, as a matter of course.

According to the structure of the present invention in which a polycrystalline semiconductor layer sandwiched by the insulating films is brought into contact with the side wall of the convex semiconductor layer or mesa, the junction area can be controlled highly precisely contributing to markedly improving the precision of the semiconductor devices.

According to the present invention, furthermore, there are provided a transistor and an integrated circuit thereof that operates at high speeds, that can be highly densely integrated and that has a high breakdown voltage.

It is further understood by those skilled in the art that the foregoing description deals with preferred embodiments of the disclosed device and that various changes and modifications may be made in the invention without departing from the spirit and scope thereof.

What is claimed is:

1. A semiconductor device comprising:
   a semiconductor substrate;
   a first insulating film being formed on the surface of said semiconductor substrate and which has an opening;
   a first mesa region of a first single crystalline semiconductor layer being partially provided in said opening, said first mesa region having a top and a side surface wherein a lower portion of said side surface is contiguous with said first insulating film;
   a second insulating film being provided on and above said first insulating film and being contiguous with the side surface of said first mesa region;
   a second single crystalline or polycrystalline semiconductor layer being provided on said first insulating film adjacent to said second insulating film and having a portion thereof which is in contact with a predetermined peripheral region of the top surface of said first mesa region; and
   an insulating layer being provided adjacent to said second single crystalline or polycrystalline semiconductor layer.

2. A semiconductor device according to claim 1, wherein said second insulating film has a lateral cross-section width which is less than that of said first insulating film.

3. A semiconductor device according to claim 1, wherein said semiconductor substrate has a first type of conductivity, a second region formed in a surface portion of said substrate, said second region having a second type of conductivity opposite to said first type of conductivity, said opening of said first insulating film, wherein said first mesa region is provided, is located on said second region, and
   said first single crystalline semiconductor layer has the second type of conductivity.

4. A semiconductor device according to claim 3, wherein a third region of the first type of conductivity is formed in said second single crystalline or polycrystalline semiconductor layer.

5. A semiconductor device according to claim 4, wherein said third region is used as a collector of emitter region, and said second region is used as a base region, to thereby constitute a bipolar transistor.

6. A semiconductor device according to claim 3, wherein said first and second type of conductivity correspond to p-type and N-type doping concentration, respectively.

7. A semiconductor device according to claim 5, wherein said first and second type of conductivity correspond to P-type and N-type doping concentration, respectively.

8. A semiconductor device according to claim 3, wherein said second region is formed as a buried layer region having a first portion wherein said first mesa region is formed thereon and a second portion wherein a base or collector takeout layer is formed thereon.

9. A semiconductor device according to claim 1, wherein said semiconductor substrate and the first single crystalline semiconductor layer have a first and a second type of conductivity, respectively, and there is further provided in said first mesa region, near the top surface, a second region of the second conductivity type used as a base region, and wherein said first mesa region includes emitter and collector regions of the first conductivity type formed at respective opposite corner portions near said top surface, to thereby form a lateral bipolar transistor.

10. A semiconductor device according to claim 9, wherein said lateral bipolar transistor is a PNP transistor.

11. A semiconductor device according to claim 9, further comprising a buried layer of highly doped impurities of the second conductivity type provided in a surface portion of said substrate in electrical contact with and beneath said first mesa region.

12. A semiconductor device comprising:
   a semiconductor substrate having a first type of conductivity;
   a first insulating film being formed on the surface of said semiconductor substrate and which has an opening;
   a first mesa region of a first single crystalline semiconductor layer, having a first type of and conductivity being provided in said opening, said first mesa region having a top and a side surface;
   a second insulating film being formed on the side surface of said first mesa region;
   a second single crystalline or polycrystalline semiconductor layer being provided on said first insulating film adjacent to said second insulating film and having a portion thereof which is in contact with a predetermined peripheral region of the top surface of first mesa region, said second single crystalline or polycrystalline semiconductor layer including a second region of a second type of conductivity opposite to the first type of conductivity; and
   an insulating layer being provided adjacent to said second single crystalline or polycrystalline semiconductor layer.

13. A semiconductor device comprising:
   a semiconductor substrate having a first type of conductivity;
   a first insulating film being formed on the surface of said semiconductor substrate and which has an opening;
   a first mesa region of a first single crystalline semiconductor layer, having a second type of conductivity opposite to the first type of conductivity, being provided in said opening, said first mesa region having a top and a side surface;
   a second region formed in a surface portion of said substrate, said second region having the second type of conductivity, and said opening of said first insulating film, wherein said first mesa region is provided, is located on said second region;
   a second insulating film being formed on the side surface of said first mesa region;
   a second single crystalline or polycrystalline semiconductor layer being provided on said first insulating film and adjacent to said second insulating film and having a portion thereof which is in contact with a predetermined peripheral region of the top surface of said first mesa region, said second single crystalline or polycrystalline semiconductor layer including a third region of the first type of conductivity, wherein said third region is used as a source or drain lead-out region;

an insulating layer being provided adjacent to said second single crystalline or polycrystalline semiconductor layer; and an insulating film being formed on the surface of said first single crystalline semiconductor layer, an electrode being formed on said insulating film, and said electrode being used as a gate region to thereby constitute as MOS transistor.

14. A semiconductor device comprising:

a semiconductor substrate having a first type of conductivity;

a first insulating film being formed on the surface of said semiconductor substrate and which has an opening;

a first mesa region of a first single crystalline semiconductor layer, having a second type of conductivity opposite to the first type of conductivity, being provided in said opening, said first mesa region having a top and a side surface;

a second region formed in a surface portion of said substrate, said second region having the second type of conductivity, and said opening of said first insulating film, wherein said first mesa region is provided, is located on said second region;

a second insulating film being formed on the side surface of said first mesa region;

a second single crystalline or polycrystalline semiconductor layer being provided on said first insulating film and adjacent to said second insulating film and having a portion thereof which is in contact with a predetermined peripheral region of the top surface of said first mesa region, said second single crystalline or polycrystalline semiconductor layer including a third region of said second type of conductivity;

a fourth region of said second type of conductivity being formed in the surface of said first mesa region, wherein said fourth region is used as a collector or emitter region, and wherein said first mesa region has a base region which is taken out through said third region, to thereby constitute a bipolar transistor; and an insulating layer being provided adjacent to said second single crystalline or polycrystalline semiconductor layer.

15. A semiconductor device comprising:

a semiconductor substrate having a first type of conductivity;

a first insulating film being formed on the surface of said semiconductor substrate and which has an opening;

a first mesa region of a first single crystalline semiconductor layer, having a second type of conductivity opposite to the first type of conductivity, being provided in said opening, said first mesa region having a top and a side surface;

a second region formed in a surface portion of said substrate, said second region having said second type of conductivity, and said opening of said first insulating film, wherein said first mesa region is provided, is located on said second region;

a second insulating film being formed on the side surface of said first mesa region;

a second single crystalline or polycrystalline semiconductor layer being provided on said first insulating film and adjacent to said second insulating film and having a portion thereof which is in contact with a predetermined peripheral region of the top surface of said first mesa region, said second single crystalline or polycrystalline semiconductor layer including a third region of the second type of conductivity;

wherein in said first mesa region there is provided a fourth region of the first type of conductivity, and a fifth region of the second type of conductivity formed in said fourth region; and an insulating layer being provided adjacent to said second single crystalline or polycrystalline semiconductor layer.

16. A semiconductor device according to claim 15, wherein said second region serves as a collector region, said third region serves as an outer base region, said fourth region serves as an inner base region, and said fifth region serves as an emitter region, to thereby constitute a bipolar transistor.

17. A semiconductor device comprising:

a semiconductor substrate having a first type of conductivity;

a first insulating film being formed on the surface of said semiconductor substrate and which has a first opening and a second opening;

a first mesa region of a first single crystalline semiconductor layer, having a second type of conductivity opposite to the first type of conductivity, being provided in said first opening, said first mesa region having a top and a side surface;

a second region formed in a surface portion of said substrate, said second region having said second type of conductivity, and said first opening of said first insulating film, wherein said first mesa region is provided, is located on said second region, wherein said second opening is formed at another portion on said second region;

a second insulating film being formed on the side surface of said first mesa region;

a second single crystalline or polycrystalline semiconductor layer being provided on said first insulating film and adjacent to said second insulating film and having a portion thereof which is in contact with a predetermined peripheral region of the top surface of said first mesa region;

a third single crystalline semiconductor layer of the second type of conductivity is formed in said second opening, and said third single crystalline semiconductor layer is electrically connected to said second region and via said second region is electrically connected to said first mesa region; and an insulating layer being provided adjacent to said second single crystalline or polycrystalline semiconductor layer.

18. A semiconductor device according to claim 15, wherein said second region serves as an emitter region, said third region serves as an outer base region, said fourth region serves as an inner base region, and said fifth region serves as a collector region, to thereby constitute a bipolar transistor.

19. A semiconductor device according to claim 18, further including a metal or a metal compound formed on the surface of said second single crystalline or polycrystalline semiconductor layer.

20. A semiconductor device comprising:

a semiconductor substrate;

a first insulating film being formed on the surface of said substrate and which has an opening;

a first mesa region comprised of a single crystalline semiconductor layer of a first type of conductivity being formed in said opening, said first mesa region having a top and a side surface;

a second insulating film being provided on the side surface of said first mesa region;

a single crystalline or polycrystalline semiconductor layer being formed on said first insulating film adjacent to said second insulating film and having a portion thereof which is in contact with a region of a predetermined width which is a corner portion of said first mesa region near the top surface thereof;

an insulating layer being provided adjacent to said single crystalline or polycrystalline semiconductor layer;

a second region being provided at said corner portion of said first mesa region and being electrically connected to said single crystalline or polycrystalline semiconductor layer, said second region having a second type of conductivity opposite to said first type of conductivity;

a third region of the second type of conductivity being provided in said first mesa region and electrically connected to said second region;

a fourth region of the first type of conductivity being provided in said third region; and wherein the impurity concentration in said second region is higher than that of said third region, and a junction position between said second region and said first mesa region is closer to said top surface than a junction position between said third region and said first mesa region.

21. A semiconductor device comprising:
a semiconductor substrate;
a first insulating film being formed on the surface of said substrate and which has an opening;
a first mesa region comprised of a single crystalline semiconductor layer of a first type of conductivity being formed in said opening, said first mesa region having a top and a side surface;
a single crystalline or polycrystalline semiconductor layer being formed on said first insulating film and being in contact with a region of a predetermined width along a top and side portion of said first mesa region near the top surface thereof;
an insulating layer being provided adjacent to said single crystalline or polycrystalline semiconductor layer;
a second region being provided at the top and side portion of said first mesa region and electrically connected to said single crystalline or polycrystalline semiconductor layer, said second region having a second type of conductivity opposite to said first type of conductivity;
a third region of the second type of conductivity being provided in said first mesa region and electrically connected to said second region;
a fourth region of the first type of conductivity being provided in said third region; and
wherein the impurity concentration in said second region is higher than that of said third region, and a junction position between said second region and said first mesa region is closer to said top surface than a junction position between said third region and said first mesa region.

22. A semiconductor device according to claim 20, wherein said semiconductor substrate has a second type of conductivity, a fifth region of the first type of conductivity is formed in a surface portion of said substrate, and the opening formed in said first insulating film is located on said fifth region.

23. A semiconductor device according to claim 16, further including metal or metal compound formed on the surface of said second single crystalline or polycrystalline semiconductor layer.

24. A semiconductor device according to claim 23, wherein said emitter region has a layer of polycrystalline silicon formed on its surface.

25. A semiconductor device according to claim 12, wherein said first and second type of conductivity correspond to the N-type and P-type doping concentration, respectively.

26. A semiconductor device according to claim 13, wherein said first and second type of conductivity correspond to P-type and N-type doping concentration, respectively.

27. A semiconductor device according to claim 17, wherein said first and second type of conductivity correspond to P-type and N-type doping concentration, respectively.

28. A semiconductor device according to claim 20, wherein said corner portion includes at least a portion of the top surface of said first mesa region.

29. A semiconductor device according to claim 20, wherein said corner portion includes both top and side surface regions of said first mesa region.

30. A semiconductor device according to claim 22, wherein said fifth region comprises a buried layer.

31. A semiconductor device according to claim 30, wherein said buried layer has a first portion wherein said first mesa region is formed thereon and a second portion wherein a sixth region of said first type of conductivity is formed thereon for effecting a takeout layer for an electrode.

32. A semiconductor device according to claim 31, wherein said takeout layer is for a collector of a bipolar transistor effected by said device.

33. A semiconductor device according to claim 32, wherein said bipolar transistor is an NPN transistor.

34. A semiconductor transistor device comprising:
a semiconductor substrate;
a first insulating film formed on the surface of said semiconductor substrate and which has an opening;
a first mesa region of a first single crystalline semiconductor layer formed on said opening, said mesa region having top and side surfaces;
a second insulating film having a side surface which is contiguous with said first insulating film formed on the side surface of said first mesa region, said second insulating film having a top and side surfaces;
a second single crystalline or polycrystalline semiconductor layer formed over a major portion of said first insulating film extends laterally to a side surface as well as over and beyond the top surface of said second insulating film so as to be in contact with a corner portion adjacent to the top surface of said first mesa region; and
an insulating layer formed adjacent to an outer side surface and the top surface of said second single crystalline or polycrystalline semiconductor layer.

35. A semiconductor transistor device according to claim 34, wherein said corner portion comprises at least a region at the outer periphery and on the top surface of said first mesa region.

36. A semiconductor transistor device according to claim 35, wherein said corner portion region comprises an entire periphery region on at least the top surface of said first mesa region.

37. A semiconductor transistor device comprising:
a semiconductor substrate;
a first insulating film being formed on the surface of said substrate and which has an opening;
a first mesa region comprised of a single crystalline semiconductor layer of a first type of conductivity being formed on said opening, said first mesa region having top and side surfaces;
a second insulating film having an end which is contiguous with said first insulation film formed on the side surface of said first mesa region, said second insulating film having a top and side surfaces;
a single crystalline or polycrystalline semiconductor layer formed over a major portion of said first insulating film extends laterally to a side surface as well as over and beyond the top surface of said second insulating film so as to be in contact over a region of a predetermined width along a corner portion near the top surface of said first mesa region;
an insulating layer being formed adjacent to an outer side surface and the top surface of said single crystalline or polycrystalline semiconductor layer;
a second region being formed at said corner portion of said first mesa region and is electrically connected to said single crystalline or polycrystalline semiconductor layer, said second region having a second type of conductivity opposite to said first type of conductivity;
a third region of the second type of conductivity being centrally formed in said first mesa region and electrically connected to said second region; and
a fourth region of the first type of conductivity being centrally formed in said third region;
wherein the impurity concentration in said second region is higher than that of said third region, and a junction position between said second region and said first mesa region is closer to said top surface than a junction position between said third region and said first mesa region.

38. A semiconductor transistor device comprising:
a semiconductor substrate;
a first insulating film being formed on the surface of said substrate and which has an opening;
a first mesa region comprised of a single crystalline semiconductor layer of a first type of conductivity being formed on said opening, said first mesa region having top and side surfaces;
a single crystalline or polycrystalline semiconductor layer formed on said first insulating film extends laterally to a side surface of said first mesa region and at least over a top surface corner region of said first mesa region so as to be in contact over a periphery region of a predetermined width along a top and side corner portion near the top surface of said first mesa region;
an insulating layer being formed adjacent to an outer side surface and the top surface of said single crystalline or polycrystalline semiconductor layer;
a second region being formed at the top and side corner portion periphery region of said first mesa region and electrically connected to said single crystalline or polycrystalline semiconductor layer, said second region having a second type of conductivity opposite to said first type of conductivity;
a third region of the second type of conductivity being centrally formed in said first mesa region and electrically connected to said second region; and
a fourth region of the first type of conductivity being centrally formed in said third region;
wherein the impurity concentration in said second region is higher than that of said third region, and a junction position between said second region and said first mesa region is closer to said top surface than a junction position between said third region and said first mesa region.

39. A semiconductor device comprising:
a semiconductor substrate having a P-type conductivity;
a first insulating film being formed on the surface of said semiconductor substrate and which has an opening;
a first mesa region of a first single crystalline semiconductor layer having an N-type conductivity and being provided in said opening, said first mesa region having a top and a side surface;
a second insulating film being formed on and above said first insulating film and being contiguous with the side surface of said first mesa region;
a second single crystalline or polycrystalline semiconductor layer being provided on said first insulating film and adjacent to said second insulating film and having a portion thereof which is in contact with a predetermining peripheral region of the top surface of said first mesa region, said single crystalline or polycrystalline semiconductor layer includes a second region used as a collector or emitter leadout region, and wherein said first mesa region includes a base haing impurities of the N-type conductivity and third and fourth regions formed therein of the P-type conductivity as emitter and collector regions, to thereby form a lateral biopolar transistor; and
an insulating layer being provided adjacent to said second single crystalline or polycrystalline semiconductor layer.

40. A semiconductor device according to claim 39, wherein said second insulating film has a lateral cross-sectional width which is less than that of said first insulating film.

* * * * *